(12) United States Patent
Nakagawa et al.

(10) Patent No.: US 6,258,702 B1
(45) Date of Patent: Jul. 10, 2001

(54) METHOD FOR THE FORMATION OF A CUPROUS OXIDE FILM AND PROCESS FOR THE PRODUCTION OF A SEMICONDUCTOR DEVICE USING SAID METHOD

(75) Inventors: Katsumi Nakagawa, Atsugi; Kozo Arao, Nara; Yukiko Iwasaki, Atsugi, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/190,100

(22) Filed: Nov. 12, 1998

(30) Foreign Application Priority Data

Nov. 12, 1997 (JP) .................................................... 9-325187

(51) Int. Cl.$^7$ .................................................... H01L 21/28
(52) U.S. Cl. ............................................. 438/570; 438/92
(58) Field of Search ............................... 438/92, 94, 104, 438/582, 570, 167, 5, 9

(56) References Cited

U.S. PATENT DOCUMENTS

| | | | |
|---|---|---|---|
| 2,081,121 | 5/1937 | Stareck | 204/1 |
| 3,781,549 | * 12/1973 | Fletcher et al. | 250/211 |
| 3,790,870 | * 2/1974 | Mitchell | 317/238 |
| 4,311,729 | * 1/1982 | Itakura et al. | 427/80 |
| 5,328,556 | * 7/1994 | Matlow | 156/643 |
| 5,858,122 | * 1/1999 | Tani et al. | 148/240 |

OTHER PUBLICATIONS

N.A. Economou et al.; Photovoltaic Solar Energy Conference (1997); "Photovoltaic Cells of Electrodeposited Cuprous Oxide"; pp. 1180–1185.

Dan Trivich et al., "Cuprous Oxide Photovoltaic Cells," 13$^{th}$ IEEE Photovoltaic Specialists Conference; pp. 174–179 (1978).

Masanobu Izaki & Takashi Omi, "Electrolyte Optimization for Cathodic Growth of Zinc Oxide Films," *J. Electrochem. Soc.*, vol. 143, No. 3, p. L53 (1996).

* cited by examiner

Primary Examiner—David Nelms
Assistant Examiner—David Nhu
(74) Attorney, Agent, or Firm—Fitzpatrick, Cella, Harper & Scinto (57) ABSTRACT

A film-forming method for forming a cuprous oxide film includes the steps of immersing a substrate having at least an electrically conductive surface in a solution containing copper ion and nitrate ion which are coexistent therein, and causing deposition of the cuprous oxide film on the electrically conductive surface of the substrate by way of cathodic reaction. A process for producing a semiconductor device such as a solar cell or a rectifier also is provided using the film-forming method.

3 Claims, 6 Drawing Sheets

METHOD FOR THE FORMATION OF A CUPROUS OXIDE FILM AND PROCESS FOR THE PRODUCTION OF A SEMICONDUCTOR DEVICE USING SAID METHOD

BACKGROUND OF THE INVENTION

1. Field of the Invention

The present invention relates to a method for forming a high duality cuprous oxide film on a desired substrate for a semiconductor device by way of a electro deposition process and a process for the production of a semiconductor device such as a photovoltaic element including a solar cell.

2. Related Background Art

Cuprous oxide films had been used as semiconductors from old times. Particularly, they had been used in the production of rectifiers in the 1920s, and in the 1930s, they had been used in the production of photodetectors. Since then, instead of such cuprous oxide film, films of selenium, cadmium sulfide, germanium, or silicon have been used, where the cuprous oxide film has been seldom used. However, it should be noted that a cuprous oxide film can be relatively easily formed at a reasonable production cost and it is not toxic, and therefore, it is still a promising material for use in the production of a photovoltaic element such as a solar cell.

By the way, the formation of a cuprous oxide film has been conducted mainly by way of thermal oxidation or anodic oxidation of a copper metal material. These methods have advantages such that their film-forming process is simple and a cuprous oxide film is formed having a high purity in a chemical sense. However, particularly for the thermal oxidation method, there are disadvantages in that the substrate temperature during the film formation is at least 300° C., usually more than 500° C. and because of this, only a substrate which is highly heat-resistant can be used; and a cuprous oxide film formed on a given substrate is liable to peel off from the substrate due to a difference between the coefficient of thermal expansion of the cuprous oxide film and that of the substrate. Besides, cuprous oxide films formed by any of these two methods are problematic in that because their formation is based on conversion of crystal structure from copper metal into cuprous oxide, they are likely to contain minute defects or to be distorted. In this respect, these cuprous oxide films are not satisfactory in terms of the electric characteristics.

Now, U.S. Pat. No. 2,081,121 discloses a method of depositing a cuprous oxide film utilizing cathodic reduction of an alkali solution of copper sulfate or the like. According to this method, because particularly high temperature is not required and no crystal structure's conversion is involved in the film formation, it seems that a good cuprous oxide film having few defects and which is slight in distortion can be formed. However, it is difficult for this method to form a desirable cuprous oxide film having a p-type property.

Besides, it is considered that reactive sputtering ban be employed in the deposition of a cuprous oxide film. However, in this case, the film composition is greatly varied due to a change in the partial pressure of oxygen, and because of this, it is difficult to repeatedly form an aimed cuprous oxide film. (see, N. A. Economou et als., *Proc. Photov. Sol. Energy Conf.* (1997), p. 1180)

In D. Trivich et als., 13*th IEEE Photov. Spec. Conf.*, p. 174, IEEE, New York, there is described that a solar cell in which a cuprous oxide film is used theoretically could attain a photoelectric conversion efficiency of 13%. However, as of the present time, there has not been realized a practically usable solar cell in which a cuprous oxide film is used and which provides practically acceptable solar cell characteristics.

In accordance with any of the conventional techniques for the formation of a cuprous oxide film, it is difficult to repeatedly form a large area cuprous oxide film having a good property. Particularly, it is almost impossible to produce a large area semiconductor device (element) having excellent characteristics at a reasonable production cost by efficiently forming a large area and high quality cuprous oxide film on a large area substrate of low heat-resistance.

SUMMARY OF THE INVENTION

The present invention is aimed at solving the foregoing problems in the prior art and providing a method which enables to efficiently form a large area and high quality cuprous oxide film having good characteristics on a desired substrate.

Another object of the present invention is to provide a method which enables to effectively grow a crystal of cuprous oxide having good characteristics even on a substrate of low heat-resistance at satisfactory reproducibility, whereby making it possible to effectively produce a large area semiconductor device (element) such as a solar cell, rectifier or the like having excellent characteristics at a reasonable production cost.

BRIEF DESCRIPTION OF THE DRAWINGS

FIGS. 1(*a*) to 1(*c*) are schematic cross-sectional views respectievy illustrating the constitution of an example of a semiconductor device in which a cuprous oxide film is used in the present invention, where FIG. 1(*a*) is a schematic cross-sectional view illustrating an example of a Schottky diode in which a cuprous oxide film according to the present invention is used, FIG. 1(*b*) is a schematic cross-sectional view illustrating another example of a Schottky diode in which a cuprous oxide film according to the present invention is used, and FIG. 1(*c*) is a schematic cross-sectional view illustrating an example of a semiconductor device having a hetero junction in which a cuprous oxide film according to the present invention is used.

FIGS. 2(*a*) and 2(*b*) are schematic diagrams illustrating a solar cell produced according to the present invention, where FIG. 2(*a*) is a schematic plan view of said solar cell, and FIG. 2(*b*) is a schematic cross-sectional view of said solar cell.

FIGS. 3(*a*) to 3(*e*) are schematic diagrams for explaining respective steps of producing a solar cell comprising a plurality of cell units integrated in series connection in the present invention.

FIGS. 4(*a*) to 4(*c*) are schematic diagrams illustrating a solar cell produced according to the present invention, where FIG. 4(*b*) is a schematic plan view of said solar cell, FIG. 4(*a*) is a schematic cross-sectional view, taken along the line A–A' in FIG. 4(*b*), and FIG. 4(*c*) is a schematic cross-sectional view, taken along the line B–B' in FIG. 4(*b*).

FIGS. 5(*a*) and 5(*b*) are schematic diagrams illustrating a hetero junction solar cell comprising a plurality of cell units integrated in series connection, produced according to the present invention, where FIG. 5(*a*) is a schematic plan view of said solar cell, and FIG. 5(*b*) is a schematic cross-sectional view of said solar cell.

DESCRIPTION OF THE INVENTION AND PREFERRED EMBODIMENTS

The present invention which attains the foregoing objects includes the following embodiments.

(1) A method for forming a cuprous oxide film, comprising the steps of immersing a substrate having at least an electrically conductive surface in a solution containing copper ion and nitrate ion which are coexistent therein, and causing deposition of said cuprous oxide film on said electrically conductive surface of said substrate by way of cathodic reaction.

(2) A method for forming a Schottky diode, comprising the steps of immersing a substrate having at least an electrically conductive surface comprising a metal in a solution containing copper ion and nitrate ion which are coexistent therein, and causing deposition of a cuprous oxide film on said metal surface of said substrate by way of cathodic reaction, whereby forming said Schottky diode.

(3) A method for forming a hetero junction, comprising the steps of immersing a substrate having at least a surface comprising an n-type semiconductor in a solution containing copper ion and nitrate ion which are coexistent therein, and causing deposition of a cuprous oxide film on said n-type semiconductor surface of said substrate by way of cathodic reaction, whereby forming said hetero junction.

(4) A method for forming a hetero junction, comprising the steps of immersing a substrate having at least an electrically conductive surface in a solution containing copper ion and nitrate ion which are coexistent therein, causing deposition of a cuprous oxide film on said electrically conductive surface of said substrate by way of cathodic reaction, immersing the resultant in a solution containing zinc ion and nitrate ion which are coexistent therein, and causing deposition of a zinc oxide film on said cuprous oxide film by way of cathodic reaction, whereby forming said hetero junction.

(5) A method for selectively forming a cuprous oxide film, comprising the steps of providing a substrate whose surface having a pattern comprising an electrically conductive region and an electrically insulating region for a semiconductor device, immersing said substrate in a solution containing copper ion and nitrate ion which are coexistent therein, and causing selective deposition of said cuprous oxide film only on said electrically conductive surface region of said substrate by way of cathodic reaction.

(6) A method for selectively forming a cuprous oxide firm comprising the steps of providing a substrate for a semiconductor device, said substrate having a surface with an electrically conductive partial region, a part of said electrically conductive partial region having a pattern comprising an aluminum or an alloy containing an aluminum as a matrix, immersing said substrate in a solution containing copper ion and nitrate ion which are coexistent therein, and causing selective deposition of said cuprous oxide film only on said electrically conductive region of said substrate other than said pattern comprising said aluminum or said alloy by way of cathodic reaction.

(7) A process for producing a semiconductor device, comprising the steps of providing a substrate having an electrically insulating surface on which a plurality of electrically conductive back electrode layers are formed so as to electrically isolate from each other and a connection terminal made of aluminum is formed for each back electrode layer so as to straddle a part of an edge portion of said back electrode layer, immersing said substrate in a solution containing copper ion and nitrate ion which are coexistent therein, causing selective deposition of a cuprous oxide film only on the electrically conductive portions other than the connection terminals on said substrate by way of cathodic reaction, and electrically connecting the surface of said cuprous oxide film formed on one of the back electrode layers with the connection terminal of the other back electrode layer adjacent to said back electrode layer.

The present invention will be detailed with reference to specific embodiments. It should be understood that the present invention is not restricted to these embodiments.

Basically, the present invention provides a film-forming method comprising the steps of immersing a substrate having an electrically conductive surface in a solution containing copper ion and nitrate ion in combination therein and applying a negative voltage to cause cathode reaction whereby selectively depositing a cuprous oxide film on said electrically conductive surface of said substrate. In the case using a substrate having a surface provided with a desired electrically conductive pattern thereon, said cuprous oxide film is selectively deposited only on the electrically conductive pattern.

The film-forming method of the present invention enables to effectively deposit & high quality cuprous oxide film over the entire surface or selectively only on a desired surface portion of a substrate under environmental condition with low temperature of 100° C. or less (specifically, at a low substrate temperature of 100° C. or less) Particularly, according to the present invention, a desired pattern having a portion deposited with a cuprous oxide film and other portion deposited with no cuprous oxide film may be formed on a given electrically conductive portion present in a surface of a substrate. This situation enables to significantly simplify particularly the production process of an integrated solar cell, resulting in a marked reduction in the production cost of an integrated solar cell.

The present invention provides a process for the production of a semiconductor device using the foregoing film-forming method. A typical embodiment of said process comprises the steps of: providing a substrate having an electrically insulation surface on which a plurality of electrically conductive back electrode layers are formed so as to electrically isolate from each other and a connection terminal made of aluminum is formed for each electrode layer so as to straddle a part of an edge of said back electrode layers, immersing said substrate in a solution containing copper ion and nitrate ion which are coexistent therein, causing selective deposition of a cuprous oxide film only on the electrically conductive portions other than the connection terminals on said substrate by way of cathodic reaction, and electrically connecting the surface of said cuprous oxide film formed on one of the back electrodes with the connection terminal of the other back electrode layer adjacent to said back electrode layer.

Details of this process for the production of a semiconductor device are as will be described below.

On a surface of an electrically insulating substrate, a plurality of electrically conductive back electrode layers are formed such that they are electrically isolated from each other, and a connection terminal made of aluminum is formed so as to lay on a part of an edge of each back electrode layer.

This substrate is immersed in a solution containing copper ion and nitrate ion in combination therein, followed by applying a negative voltage, where cathode reaction is caused to selectively deposit a p-type cuprous oxide film only on the electrically conductive portions other than the connection terminals. In this case, when each of the back electrode layers is constituted by a metal such as copper, a Schottky junction is established. And when an n-type semiconductor material such as zinc oxide or the like is deposited thereon, a hetero junction is established. The hetero junction herein generates an electromotive force upon the irradiation of light.

By electrically connecting the surface of the cuprous oxide film (or the n-type semiconductor material deposited on the the cuprous oxide film) of one of the back electrode layers with the connection terminal of the other back electrode layer adjacent thereto, an integrated series connection type solar cell can be readily produced. In this process, bypass diodes can be formed at the same time.

According to the process of the present invention, an integrated series connection type solar cell can be formed on an inexpensive substrate made of a synthetic resin or the like by a simple manner without using a laser-scribing method or the like in which an optimum condition is delicate. And if necessary, bypass diodes can be readily built in without complicating the process. Hence, a highly reliable solar cell can be produced at a reasonable production cost.

The present inventors conducted extensive studies of the prior art aiming at attaining the objects of the present invention. As a result, there were obtained such knowledges as will be described below. Then, based on the knowledges, the present inventors conducted experiments and obtained findings, and the present invention has been accomplished based on the findings. This situation will be described later.

First, description will be made of the knowledges obtained by the present inventors.

In the foregoing U.S. Pat. No. 2,081,121, there is described that a cuprous oxide film formed by way of cathodic reduction of an alkali solution of copper sulfate or the like is high in electric resistance. For the reason for this, it is considered such that though the cuprous oxide film has a few crystal defects, it is substantially intrinsic because of lacking in acceptors or containing donors generated. More particularly, when it is assumed that no impurity should be incorporated during the film formation described in this document, it is considered such that Cu, which is to be naturally monovalent in the crystal of cuprous dioxide, would become divalent to function as a donor, and because of this, the cuprous oxide, which is usual to be of p-type, would become intrinsic. In this connection, if the process for Cu to be oxidized could be precisely controlled, it is considered that a p-type cuprous oxide film having low electric resistance can be formed.

The present inventors presume the process for a metal oxide film to be formed on a cathode electrode as follows. That is, on a cathode electrode immersed in a solution containing metal ion and an oxygen-containing agent (comprising ions or molecules), the agent is reduced to generate oxygen, where the oxygen reacts with the metal ion to cause the formation of a metal oxide. The normal electrode potential for the agent to generate the oxygen herein is variable depending upon the kind of the agent to be used. In the case where the metal involved may take different valence numbers, the probability for the metal to be readily taken in at which valence number is variable depending upon the value of the normal electrode potential. In this connection, in the case of Cu, there is a possibility that the use of a relevant agent enables cuprous oxide to be p-type cuprous oxide and to have low electric resistance with no incorporation of divalent Cu.

In Izaki et al., a *J. Electro Chem. Sci.*, vol. 143, No. 3, March 1996, p. L53, there is described that a zinc oxide film was deposited on a cathode electrode immersed in an aqueous solution of zinc nitrate. In this case, it is considered that nitrate ion serves as an agent.

Based on the above described knowledges, putting in mind of using nitrate ion as an agent in the formation of a copper oxide film, the present inventors conducted experiments as will be described below.

Experiment 1

There were prepared a plurality of aqueous solutions containing 0.01 mol/l of copper nitrate. A stainless steel plate of 5 cm×5 cm in size having an acid-treated surface and whose rear face being covered by an insulating film was immersed in each aqueous solution, and a copper plate of 5 cm×5 cm in size was also immersed in the aqueous solution so as to oppose the stainless steel plate while having a distance of 5 cm between the two members. Here, stainless steel plate and the copper plate were electrically connected to a galvanostad so that the stainless steel plate was a cathode electrode and the copper plate was an anode electrode. While maintaining the temperature of the aqueous solution in which the stainless steel plate and the copper plate are thus arranged at a given temperature in the range of 25° C. to 85° C. as shown in Table 1, there was flown an electric current of a given value in the range of 6 mA to 14 mA as shown in Table 1 from the galvanostad. The exposed surface of the stainless steel plate in each case was examined. The examined results are collectively shown in Table 1.

The term [Cu-deposited] in Table 1 indicates a case wherein the exposed surface of the stainless steel plate was copper-colored and X-ray diffraction of the film revealed a crystal of Cu (copper metal).

The term [brown deposit] in Table 1 indicates a case wherein the exposed surface of the stainless steel plate was mat brown-colored, optical microscopic observation of the film revealed irregular dendritic deposits and X-ray diffraction of the film revealed any specific peak other than a peak of stainless steel.

The term [black deposit] in Table 1 indicates a case wherein the exposed surface of the stainless steel plate was mat black-colored, optical microscopic observation of the film revealed irregular dendritic deposits and X-ray diffraction of the film revealed any specific peak other than a peak of stainless steel.

The term [brown/blackdeposit] in Table 1 indicates a case wherein the periphery of the exposed surface of the stainless steel plate was covered by a black deposit and the central portion thereof was covered by a brown deposit.

Figure 6:
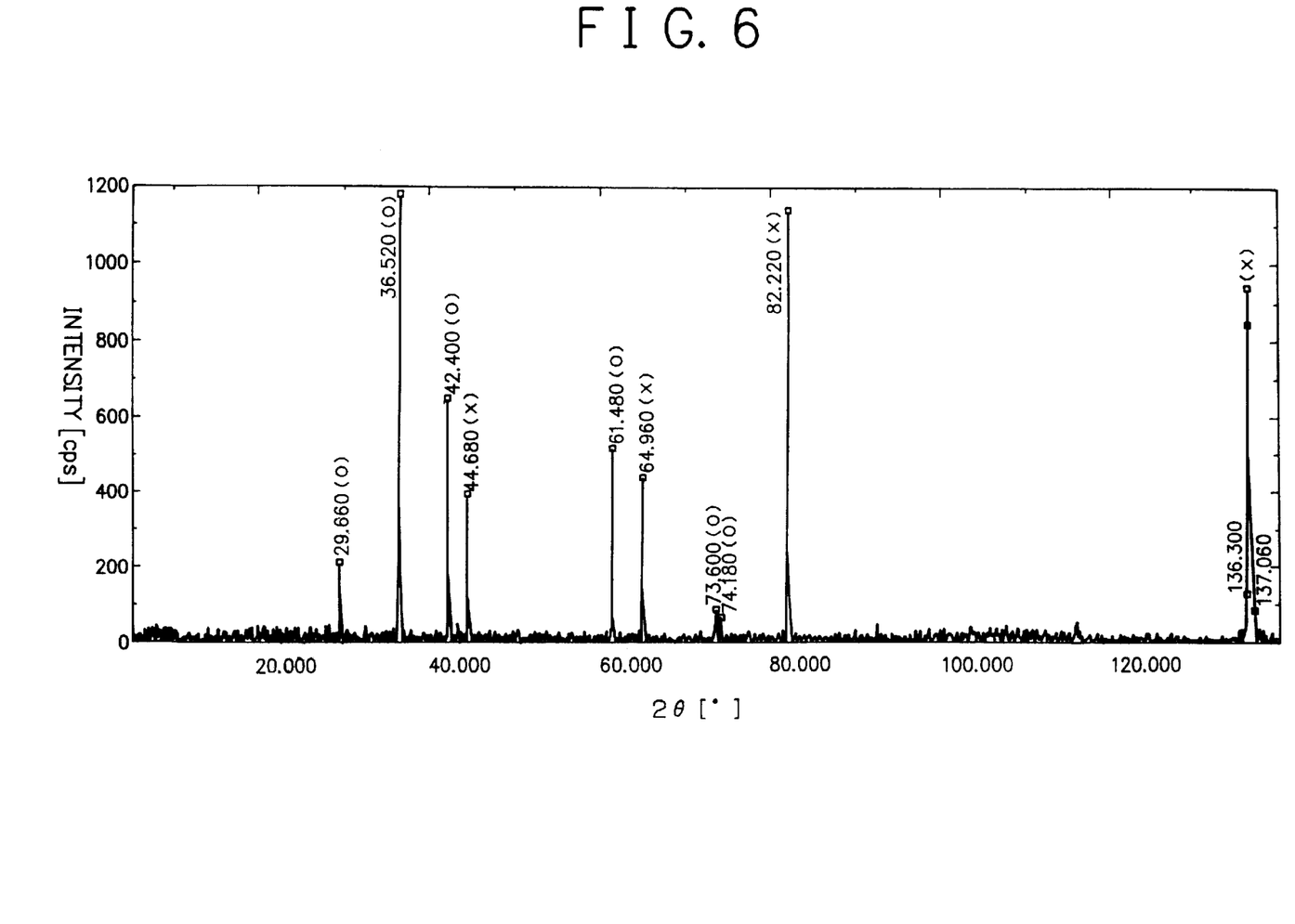
FIG. 6 shows a X-ray diffraction pattern of a cuprous oxide film according to the present invention.

The term [murex thin film] in Table 1 indicates a case wherein a purplish red thin film was deposited on the exposed surface of the stainless steel plate, optical microscopic observation of the film revealed an aggregate comprising a number of small cubic crystal grains glomerated on the exposed surface of the stainless steel plate, and X-ray diffraction of the film revealed a specific peak with strong intensity of a crystal of cuprous oxide as shown in FIG. 6 [see, particularly 36.520 (0)]. The peaks added with a mark (0) in FIG. 6 are of the cuprous oxide.

In any case, in the X-ray diffraction, although peaks belonging to the stainless steel (see, peeks (x) in FIG. 6) were observed, no peak belonging to cupric oxide was observed. That is, as apparent from the results shown in Table 1, in a quite large conditional rage where the temperature of the aqueous solution was more than 55° C., the deposition of a cuprous oxide film was recognized.

Experiment 2

The procedures of Experiment 1 were repeated, except that the aqueous solution was changed to an aqueous solution having a nitrate ion concentration which is two times that of the aqueous solution used in Experiment 1 and which is obtained by adding nitric acid in a prescribed amount to a 0.01 mol/l copper nitrate aqueous solution, and the temperature of the aqueous solution during the treatment was fixed at 55 ° C. The exposed surface of the stainless steel plate in each case was examined. The examined results are collectively shown in Table 2 In Table 2, the examined results obtained in Experiment 1 when the temperature of the aqueous solution was 55° C. are also shown.

Then, the procedures of Experiment 1 were again repeated, except that the aqueous solution was changed to an aqueous solution having a nitrate ion concentration which is five times that of the aqueous solution used in Experiment 1 and which is obtained by adding nitric acid in a prescribed amount to a 0.01 mol/l copper nitrate aqueous solution, and the temperature of the aqueous solution during the treatment was fixed at 55 ° C. The exposed surface of the stainless steel plate in each case was examined. The examined results are collectively shown in Table 2.

Based on the results shown in Table 2, it was found that the conditional rage which enables the deposition of a cuprous oxide film can be enlarged by increasing the nitrate ion concentration of the aqueous solution.

Experiment 3

The procedures of Experiment 1 were repeated, except that the stainless steel plate was replaced by a glass plate of 5 cm×5 cm in size having a surface deposited with a copper film on a half surface area thereof by means of sputtering so that energization can be conducted through the copper film, the temperature of the aqueous solution during the treatment was fixed at 70° C., and only an electric current of 5 mA was flown. As a result, there was observed the deposition of a film only on the copper film deposited on the surface of the glass plate.

The film deposited on the copper film was examined by means of an optical microscope. The film was found to comprise an aggregate comprising a number of clear and small cubic crystal grains glomerated on the copper film. And the film was subjected to X-ray diffraction. As a result, the film was recognized to be a cuprous oxide film.

On the exposed surface of the glass plate, no film deposition was observed. For the reason for this, it is considered such that no electric current is flown to the glass portion, and because of this, no cathodic reaction is occurred on the exposed glass surface of the glass plate.

Experiment 4

The procedures of Experiment 1 were repeated, except that the stainless steel plate was replaced by a copper plate of 5 cm×5 cm in size having a surface deposited with an aluminum film on a half surface area thereof by means of sputtering, the temperature of the aqueous solution during the treatment was fixed at 70° C., and only an electric current of 5 mA was flown. As a result, there was observed the deposition of a film only on the exposed copper surface of the copper plate.

The film deposited on the exposed copper surface was examined by means of an optical microscope. The film was found to comprise an aggregate comprising a number of clear and small cubic crystal grains glomerated on the exposed copper surface of the copper plate. And the film was subjected to X-ray diffraction. As a result, the film was recognized to be a cuprous oxide film.

On the surface of the aluminum film deposited on the copper plate, substantially no film deposition was observed. For the reason for this, it is not clear enough at the present timed, but it is considered such that a surface region of the aluminum film is converted into an oxide film and the oxide film prevents the electric current from flowing or hinders cathodic reaction from occurring at the surface.

Based on the above results, there were obtained such findings as will be described in the following. That is, it is possible to selectively form a cuprous oxide film at a desired position on a substrate under environmental condition with low temperature of less than 100° C. (that is, at a low substrate temperature of less than 100° C.) Particularly, it is possible to form a desired pattern having a position deposited with a film and another portion deposited with no film even on an electrically conductive portion. This situation enables to extremely simplify the production process of an integrated solar cell as described in examples which will be described later.

Experiment 5

Figure 1A:
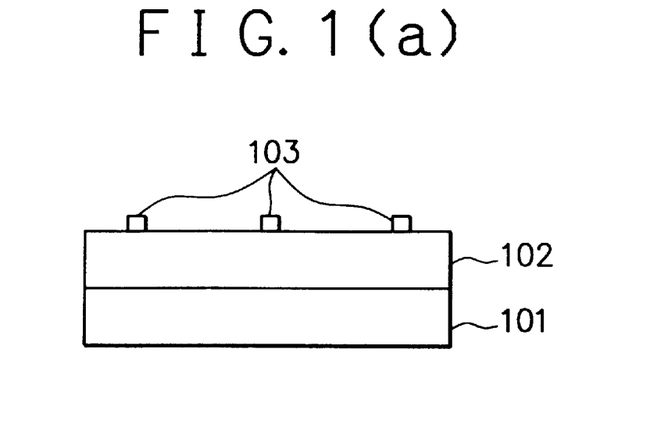

(1). There was prepared a Schottky diode (Sample 1a) having such configuration as shown in FIG. 1($a$) by repeating the procedures of Experiment 1, except that the stainless steel plate was replaced by a copper plate 101, the temperature of the aqueous solution during the treatment was fixed at 70° C., and only an electric current of 5 mA was flown, whereby forming a deposited film 102 on the copper plate 101. The deposited film 102 formed on the copper plate 101 was examined by means of an optical microscope. The film was found to comprise an aggregate comprising a number of clear and small cubic crystal grains glomerated on the surface of the copper plate. And the film was subjected to X-ray diffraction. As a result, the film was recognized to be a cuprous oxide film on the deposited film 102, a patterning mask for the formation of a comb-shaped collecting electrode was laid, followed by subjecting to vacuum evaporation of Au to form a comb-shaped collecting electrode 103 on the deposited film 102. Thus, there was obtained a Schottky diode as Sample 1a.

(2). For comparison purposes, there was prepared a Schottky diode (Sample 1b) in which an copper oxide film formed by way of thermal oxidation is used. That is, a copper plate 101 was subjected to heat treatment at 1000° C. in a oxygen gas stream to form a copper oxide film 102 on the surface of the copper plate. The copper oxide film thus formed was subjected to X-ray diffraction. As a result, a peak belonging to cuprous oxide was observed but no peak belonging to cupric oxide was observed. However, as a result of examining the copper oxide film by means of an optical microscope, it was found that the copper oxide film does not comprise such aggregate of precise crystal grains as found in Experiment 1 but comprise an aggregate of crystal grains having cracks at several portions.

On the copper oxide film 102, there was formed a comb-shaped collecting electrode 103 in the same manner as in the above (1). Thus, there was obtained a Schottky diode as Sample 1b.

(3). For comparison purposes, there was prepared a Schottky diode (Sample 1c) in which a copper oxide film formed by way of Stareck method is used. That is, there was provided one liter of an aqueous solution containing 64 g/l of cupric sulfate, 150 ml/l of lactic acid, 100 g/l of sodium hydroxide, and 50 g/l of sodium carbonate. A copper plate 101 of 5 cm×5 cm in size whose rear face being covered by an insulating film was immersed in the aqueous solution as a cathode, and another copper plate of 5 cm×5 cm in size was also immersed in the aqueous solution as an anode so as to oppose the cathode while having a distance between the cathode and the anode. And the cathode and the anode were electrically connected to a potentiostad. While maintaining the temperature of the aqueous solution at 36° C., a voltage of 0.4 V from the potentiostad was applied between the two electrodes to form a copper oxide film 102 on the exposed surface of the copper plate 101. The copper oxide film thus formed was examined by means of an optical microscope. As a result, the copper oxide film was found to comprise an aggregate of cubic crystal grains having substantially no distinguishable cracks. But as a result of subjecting the copper oxide film to X-ray diffraction, there were observed several peaks belonging to cupric oxide among peaks belonging to cuprous oxide.

On the copper oxide film 102, there was formed a comb-shaped collecting electrode 103 in the same manner as in the above (1). Thus, there was obtained a Schottky diode as Sample 1c.

For each of the resultant three samples, Samples 1a, 1b, and 1c, evaluation was conducted with respect to the characteristics as a solar cell using a solar simulator. As a result, Sample 1a was found to have a photoelectric conversion efficiency of 3.5%. Sample 1b was found to have an extremely low open-circuit voltage (Voc) and a photoelectric conversion of only 0.7% which is extremely small. Sample 1c was found to have an extremely low short-circuit current (Jsc) and a photoelectric conversion of only 0.3% which is also extremely small.

Then, each of the three samples was evaluated with respect to the characteristics as a rectifier. Particularly, for each sample, a voltage of ±1 V (the collecting electrode makes a positive voltage to be a forward direction) was applied, where the ratio for the electric currents flown [that is, rectification ratio (r)=J(+1 V)/J(−1 V)] was evaluated. As a result, it was found that $r=1\times10^4$ for Sample 1a. On the other hand, in the case of Sample 1b, the reverse current was great and because of this, only r=20 was obtained. In the case of Sample 1c, the forward current was great and because of this, only $r=4\times10^2$ was obtained.

Based on the above results, it is understood that the Schottky diode according to the present invention exhibits excellent characteristics not only as a solar cell but also as a rectifier.

Experiment 6

There was prepared a hetero junction semiconductor device having such configuration as shown in FIG. 1(a) by repeating the procedures of Experiment 1, except that the stainless steel plate was replaced by an n-type polycrystalline silicon wafer 101, the temperature of the aqueous solution during the treatment was fixed at 70° C., and only an electric current of 5 mA was flown, whereby forming a deposited film 102 on the silicon wafer 101.

The deposited film 102 formed on the silicon wafer 101 was examined by means of an optical microscope. The film was found to comprise an aggregate comprising a number of clear and cubic crystal grains glomerated on the surface of the silicon wafer. And the film was subjected to X-ray diffraction. As a result, the film was recognized to be a cuprous oxide film.

On the deposited film 102, a patterning mask for the formation of a comb-shaped collecting electrode was laid, followed by subjecting to vacuum evaporation of Au to form a comb-shaped collecting electrode 103 on the deposited film 102. Thus, there was obtained a hetero junction semiconductor device.

The resultant semiconductor device was evaluated with respect to the characteristics as a solar cell using a solar simulator. As a result, the semiconductor device was found to have a photoelectric conversion efficiency of 4.5%.

Then, the semiconductor device was evaluated with respect to the characteristics as a rectifier in the same manner as in Experiment 5. As a result, the semiconductor device was found to have a rectification ratio of $2\times10^4$.

Based on the results obtained in the above experiments, there was obtained a finding that the film-forming method according to the present invention enables one to effectively form a high quality cuprous oxide film having excellent characteristics suitable for use in the production of a semiconductor device such as a solar cell or a rectifier, said cuprous oxide film being superior to a cuprous oxide film formed by the conventional film-forming method in terms of the quality and characteristics.

For this reason for this, it is suggested not to use the film-forming method by way of thermal oxidation in which copper crystal is converted into cuprous oxide crystal in the solid phase. The film-forming method according to the present invention, because film deposition (crystal growth) is occurred on a substrate from the liquid phase, the film deposited hardly suffers from a defect or distortion, and the use of an agent comprising nitrate ion effectively prevents copper from being in a divalent state, whereby a high quality cuprous oxide film having a p-type conductivity can be effectively formed.

In the following, the features and advantages of the present invention will be described in more detail with reference to examples. It should be understood that these examples are only for illustrative purposes and are not intended to restrict the scope of the present invention to these examples.

EXAMPLE 1

Figure 1B:
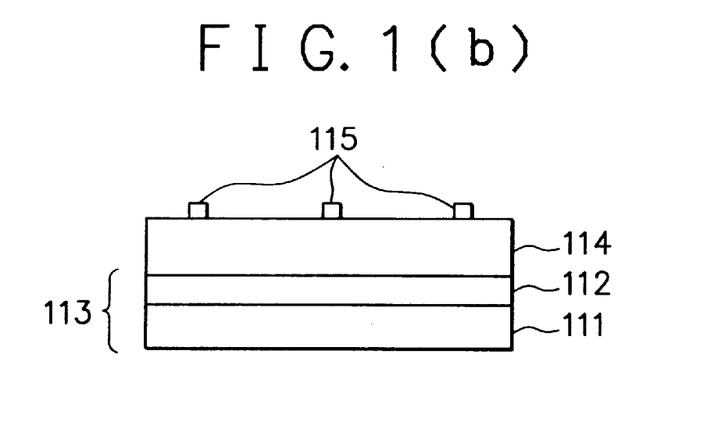

In this example, there was prepared a semiconductor device with a Schottky barrier, having such configuration as shown in FIG. 1(b). This semiconductor device was prepared in the following manner.

On the surface of a film 111 made of PET (polyethylene terephthalate) of 0.2 mm in thickness and 10 cm×10 cm in size, a 1000 Å thick back electrode layer 112 composed of Cu was formed by means of sputtering. The resultant was made to be a substrate 113.

The substrate 113 was immersed in 5 liters of a 0.01 mol/l copper nitrate aqueous solution, and a copper plate of 10 cm×10 cm in size was immersed in the aqueous solution so as to oppose the back electrode layer 112 of the substrate 113 while having a distance of 5 cm between the two members. Here, the substrate 113 and the copper plate were electrically connected to a galvanostad so that the substrate was a cathode electrode and the copper plate was an anode electrode. While maintaining the aqueous solution in which the substrate and the copper plate are thus arranged at 85° C., there was flown an electric current of 50 mA from the galvanostad, whereby a cuprous oxide film 114 was deposited on the surface of the back electrode layer 112 of the substrate 113. In this case, no film was deposited on the remaining face of the substrate.

Then, on the surface of the cuprous oxide film 114 thus formed on the back electrode layer of the substrate, an Ag-paste was screen-printed to form a comb-shaped collecting electrode 115. Thus, there was obtained a semiconductor device having the configuration shown in FIG. 1(b).

The resultant semiconductor device was evaluated with respect to the characteristics as a solar cell and also as a rectifier in the same manner as in Experiment 5. As a result, the semiconductor device was found to have a good photoelectric conversion efficiency and a good rectification ratio as well as the semiconductor device obtained in Experiment 5-(1).

As previously described, in the present invention, a high quality cuprous oxide film can be effectively formed at a low temperature of less than 100 ° C. (that is, a low substrate temperature of less than 100° C.), an inexpensive ordinary synthetic resin film can be used as the substrate.

EXAMPLE 2

Figure 1C:
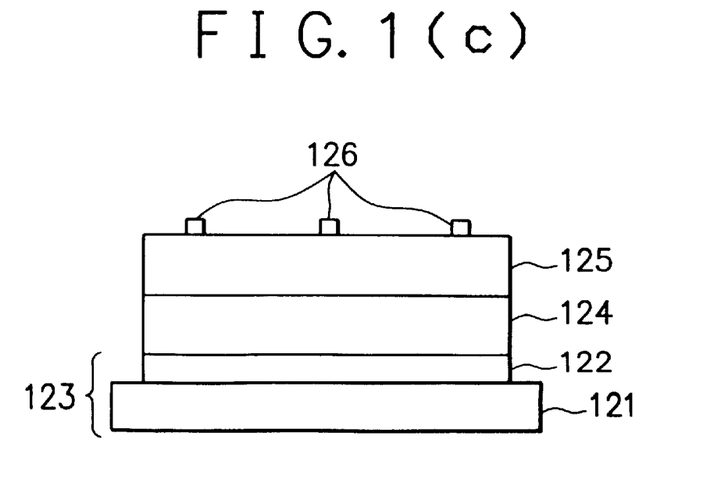

In this example, there was prepared a semiconductor device with a hetero junction, having such configuration as shown in FIG. 1(c). This semiconductor device was prepared in the following manner.

On the surface of a film 121 made of PET (polyethylene terephthalate) of 0.2 mm in thickness and 11 cm×11 cm in size, a patterning mask capable of providing an actual area of 10 cm×10 cm was laid, followed by forming a 1000 Å thick back electrode layer 122 composed of Ag by means of sputtering. The resultant was made to be a substrate 123.

The substrate 123 was immersed in 5 liters of a 0.01 mol/l zinc nitrate aqueous solution, and a zinc plate of 10 cm×10 cm in size was immersed in the aqueous solution so as to oppose the back electrode layer 122 of the substrate 123 while having a distance of 5 cm between the two members. Here, the substrate 123 and the zinc plate were electrically connected to a galvanostad so that the substrate was a cathode electrode and the zinc plate was an anode electrode. While maintaining the aqueous solution in which the substrate and the zinc plate are thus arranged at 70° C., there was flown an electric current of 40 mA from the galvanostad, whereby a zinc oxide film 124 was deposited on the surface of the back electrode layer 122 of the substrate 123. In this case, the film deposition was occurred only on the surface of the back electrode layer 122. As a result of examining the film 124 thus formed by means of an optical microscope, the film was found to an aggregate of clear and small hexagonal prismatic crystal grains. And as a result of subjecting the film to X-ray diffraction, the film was recognized to comprise zinc oxide.

The substrate 123 having the zinc oxide film 124 formed thereon was well washed with pure water, and it was immersed in 5 liters of a 0.02 mol/l copper nitrate aqueous solution, and a copper plate of 10 cm×10 cm in size was immersed in the aqueous solution so as to oppose the zinc oxide film 124 of the substrate 123 while having a distance of 5 cm between the two members. Here, the substrate 123 and the copper plate were electrically connected to a galvanostad so that the substrate was a cathode electrode and the copper plate was an anode electrode. While maintaining the aqueous solution in which the substrate and the copper plate are thus arranged at 85° C., there was flown an electric current of 50 mA from the galvanostad, whereby a cuprous oxide film 125 was deposited on the surface of the zinc oxide film 124 of the substrate 123. In this case, the film deposition was occurred only on the surface of the zinc oxide film 124.

Then, on the surface of the cuprous oxide film 125 thus formed on the zinc oxide film of the substrate, an Ag-paste was screen-printed to form a comb-shaped collecting electrode 126. Thus, there was obtained a semiconductor device having the configuration shown in FIG. 1(c).

The resultant semiconductor device was evaluated with respect to the characteristics as a solar cell and also as a rectifier in the same manner as in Experiment 5. As a result, the semiconductor device was found to have a good photoelectric conversion efficiency and a good rectification ratio as well as the semiconductor device obtained in Experiment 6.

EXAMPLE 3

In this example, there was prepared a semiconductor device with a hetero junction, having such configuration as shown in FIG. 1(c). This semiconductor device was prepared in the following manner.

On the surface of a film 121 made of PET (polyethylene terephthalate) of 0.2 mm in thickness and 11 cm×11 cm in size, a patterning mask capable of providing an actual area of 10 cm×10 cm was laid, followed by forming a 1000 Å thick back electrode layer 122 composed of Ag by means of sputtering. The resultant was made to be a substrate 123.

The substrate 123 was immersed in 5 liters of a 0.02 mol/l copper nitrate aqueous solution, and a copper plate of 10 cm×10 cm in size was immersed in the aqueous solution so as to oppose the back electrode layer 122 of the substrate 123 while having a distance of 5 cm between the two members. Here, the substrate 123 and the copper plate were electrically connected to a galvanostad so that the substrate was a cathode electrode and the copper plate was an anode electrode. While maintaining the aqueous solution in which the substrate and the copper plate are thus arranged at 85° C., there was flown an electric current of 40 mA from the galvanostad, whereby a cuprous oxide film 124 was deposited on the surface of the back electrode layer 122 of the substrate 123. In this case, the film deposition was occurred only on the surface of the back electrode layer 122. As a result of examining the film 124 thus formed by means of an optical microscope, the film was found to an aggregate of clear and small cubic crystal grains. And as a result of subjecting the film to X-ray diffraction, the film was recognized to comprise cuprous oxide.

The substrate 123 having the cuprous oxide film 124 formed thereon was well washed with pure water, and it was immersed in 5 liters of a 0.01 mol/l zinc nitrate aqueous solution, and a zinc plate of 10 cm×10 cm in size was immersed in the aqueous solution so as to oppose the cuprous oxide film 124 of the substrate 123 while having a distance of 5 cm between the two members. Here, the substrate 123 and the zinc plate were electrically connected to a galvanostad so that the substrate was a cathode electrode and the zinc plate was an anode electrode. While maintaining the aqueous solution in which the substrate and the copper plate are thus arranged at 85° C., there was flown an electric current of 50 mA from the galvanostad, whereby a zinc oxide film 125 was deposited on the surface of the cuprous oxide film 124 of the substrate 123. In this case, the film deposition was occurred only on the surface of the cuprous oxide film 124.

Then, on the surface of the zinc oxide film 125 thus formed on the cuprous oxide film of the substrate, an Ag-paste was screen-printed to form a comb-shaped collecting electrode 126. Thus, there was obtained a semiconductor device having the configuration shown in FIG. 1(c).

The resultant semiconductor device was evaluated with respect to the characteristics as a solar cell in the same manner as in Experiment 5. As a result, the semiconductor device was found to have a good photoelectric conversion efficiency as well as the semiconductor device obtained in Experiment 6. For the output voltage, in contrast with the semiconductor device obtained in Experiment 6, a negative voltage was obtained on the collecting electrode 126 side. In addition, for the semiconductor device obtained in this example, evaluation was conducted with respect to the characteristics as a rectifier in the same manner as in Experiment 5. As a result, the semiconductor device was found to have a good rectification ratio. In this case, in contrast with the case of Experiment 5, the rectification ratio was based on a ratio of J(−1 V)/J(+1 V).

As described in Examples 2 and 3, the formation of a zinc oxide film as an n-type semiconductor can be conducted in the same manner of forming a cuprous oxide film. Hence, it is understood that according to the present invention, a desirable hetero junction structure can be conducted on an inexpensive substrate having low heat resistance. However, there are known more great many kinds of materials usable as an n-type semiconductor than those known usable as a p-type semiconductor. Specific examples of such material usable as an n-type semiconductor are ITO, $SnO_2$, ZnO, and the like. It is possible to readily form a desirable n-type semiconductor film of any of these materials by means of vacuum evaporation or sputtering. In the present invention, the formation of a hetero junction structure may be conducted using such n-type semiconductor film formed in this way in combination with a cuprous oxide film as a p-type semiconductor formed according to the present invention.

EXAMPLE 4

Figure 2A:
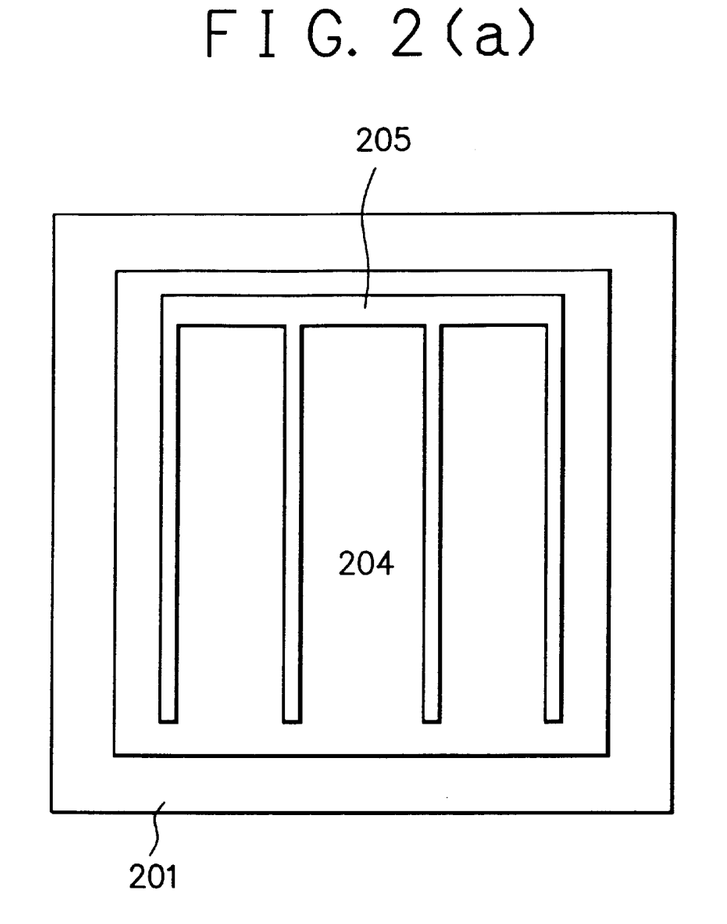
Figure 2B:
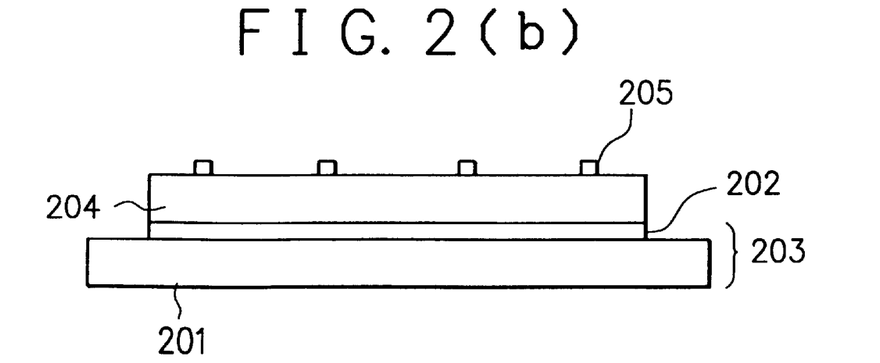

In this example, there was prepared a solar cell having such configuration as shown in FIGS. 2(a) and 2(b). FIG. 2(a) is a schematic plan view, and FIG. 2(b) is a schematic cross-sectional view. This solar cell was prepared in the following manner.

On the surface of a film 201 made of PET (polyethylene terephthalate) of 0.2 mm in thickness and 11 cm×11 cm in size, a patterning mask capable of providing an actual area of 10 cm×10 cm was laid, followed by forming a 1000 Å thick Cu-film as a back electrode layer 202 by means of sputtering. The resultant was made to be a substrate 203.

The substrate 203 was immersed in a 0.02 mol/l copper nitrate aqueous solution, and a copper plate of 10 cm×10 cm in size was immersed in the aqueous solution so as to oppose the back electrode layer 202 of the substrate 203 while having a distance of 5 cm between the two members. Here, the back electrode layer 202 of the substrate 203 and the copper plate were electrically connected to a galvanostad so that the back electrode layer of the substrate was a cathode electrode and the copper plate was an anode electrode. While maintaining the aqueous solution in which the substrate and the copper plate are thus arranged at 85° C., there was flown an electric current of 50 mA from the galvanostad, whereby a cuprous oxide film 204 was deposited on the surface of the back electrode layer 202 of the substrate 203. In this case, the film deposition was occurred only on the surface of the back electrode layer 202.

Then, on the surface of the cuprous oxide film 204 thus formed on the back electrode layer 202 of the substrate 203, an Ag-paste was screen-printed to form a comb-shaped collecting electrode 205. Thus, there was obtained a solar cell having an active area of 10 cm×10 cm. Here, a Schottky junction was established between the back electrode layer 202 composed of Cu and the cuprous oxide film 204. In this junction, the cuprous oxide film 204 side generates a positive electromotive force upon the irradiation of light.

The resultant solar cell was evaluated using a solar simulator. As a result, the solar cell was found to exhibit good solar cell characteristics.

In the present invention, a high quality cuprous oxide film can be effectively formed at a low substrate temperature of less than 100° C., and because of this, using an inexpensive ordinary synthetic resin film as the substrate, a desirable solar cell can be produced.

EXAMPLE 5

In this example, there was prepared a solar cell having such configuration shown in FIGS. 3(a) to 3(e). Particularly, FIGS. 3(a) to 3(e) are schematic diagrams for explaining respective steps of producing a solar cell comprising a plurality of cell units integrated in series connection in the present invention. The solar cell was prepared in the following manner.

As a base member 301, there was provided a film made of PET (polyethylene terephthalate) having a thickness of 0.2 mm and a size of 11 cm×12 cm. On the PET film as the base member 301, a patterning mask having five rectangular openings of 10 cm×2 cm in size which are spacedly arranged while having an equal interval (303) of 2 mm between each adjacent openings was laid, followed by subjecting to film deposition of Cu by means of sputtering, whereby five rectangular back electrode layers 302 of 10 cm×2 cm in size each comprising a copper film were formed such that they were specedly arranged while having an interval 303 of 2 mm between each adjacent back electrode layers [see, FIG. 3(a)].

For each of the back electrode layers, at an end portion thereof, an connection terminal 304 of 2 mm in width and 10 cm in length comprising an aluminum was formed by way of sputtering using a patterning mask. The resultant was made to be an substrate 305 [see, FIG. 3(b)]. Here, a half of the width of the connection terminal 304 is laid on a part of each back electrode layer 302, and the remaining half is laid on the PET film.

Figure 3A:
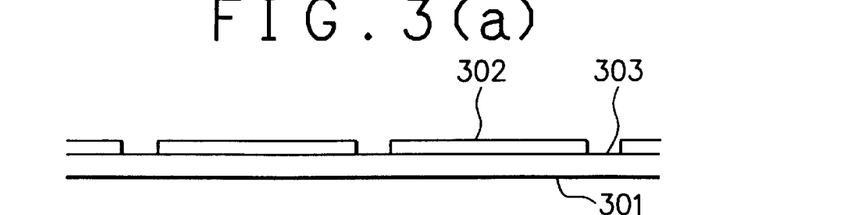
Figure 3B:
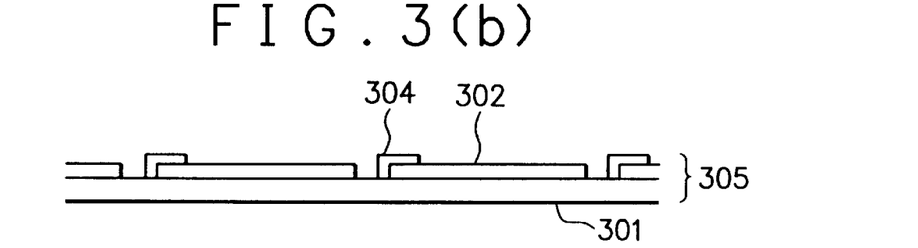
Figure 3C:
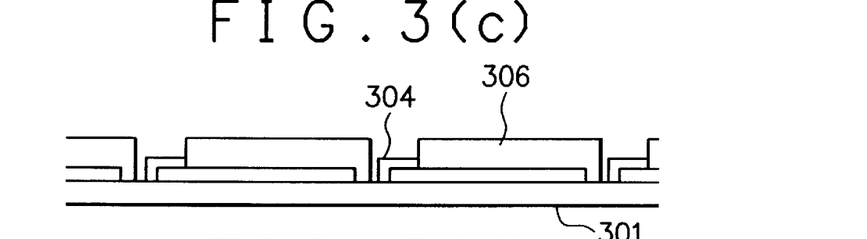

While confirming that each of the back electrode layers 302 is electrically connected with the connection terminal 304, in accordance with the procedures for the formation of a cuprous oxide film in Example 4, there was deposited a cuprous oxide film 306 on each back electrode layer 302 [see, FIG. 3(c)], where no cuprous oxide film was deposited on portions with no back electrode layer and on the aluminum connection terminals 304. Thus, there were formed five separate cell units each comprising the copper film, the back electrode layer and the cuprous oxide film stacked in this order on the base member 301. Then, an Ag-paste was screen-printed to form a collecting electrode 307 on the cuprous oxide film 306 of each cell unit [see, FIG. 3(d)]. Here, the collecting electrode 307 is patterned such that the collecting electrode formed on one of the cell unit is electrically connected with the back electrode layer of the cell unit adjacent to said cell unit, whereby all the cell units are electrically connected with each other in series connection.

Figure 3D:
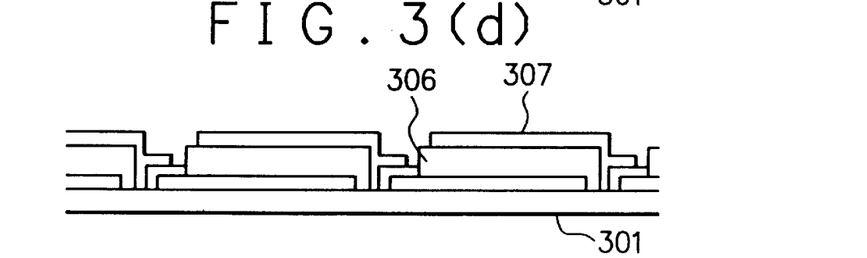
Figure 3E:
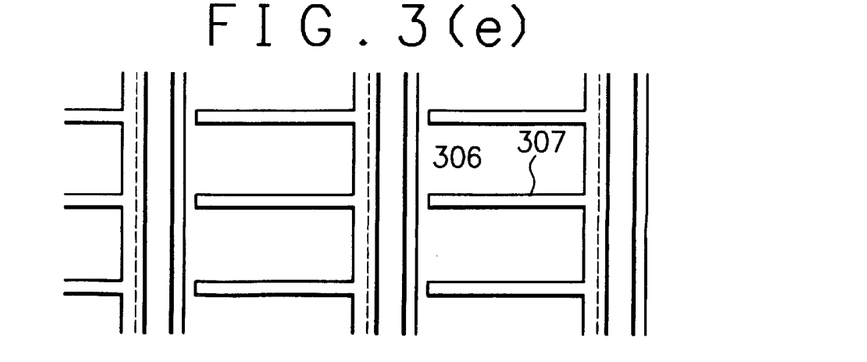

FIG. 3(e) is a schematic view illustrating a light receiving face side of the configuration shown in FIG. 3(d).

Thus, there was obtained an integrated series connection type solar cell.

The resultant solar cell was evaluated using a solar simulator. As a result, the solar cell was found to exhibit satisfactory solar cell characteristics.

As above described, according to the present invention, a desirable integrated series connection type solar cell can be produced in a simple manner without using a laser scribing manner or the like.

In the case of the solar cell obtained in this example, as the area of each of the constituent cell units is small, the constituents of the collecting electrode, which diminish the quantity of an electric current flown, can be desirably thinned. This situation can diminish a so-called shadow loss due to the collecting electrode.

EXAMPLE 6

Figure 4A:
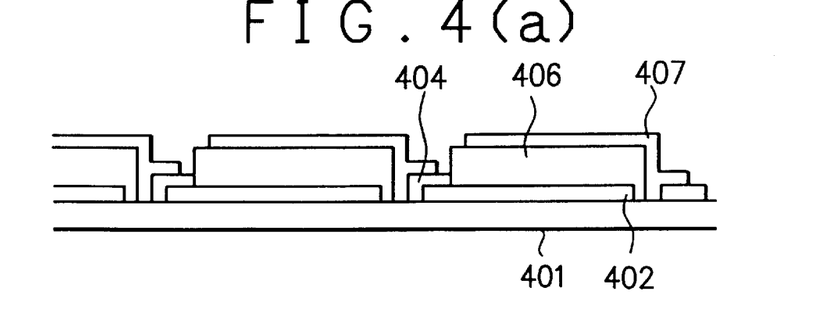
Figure 4B:
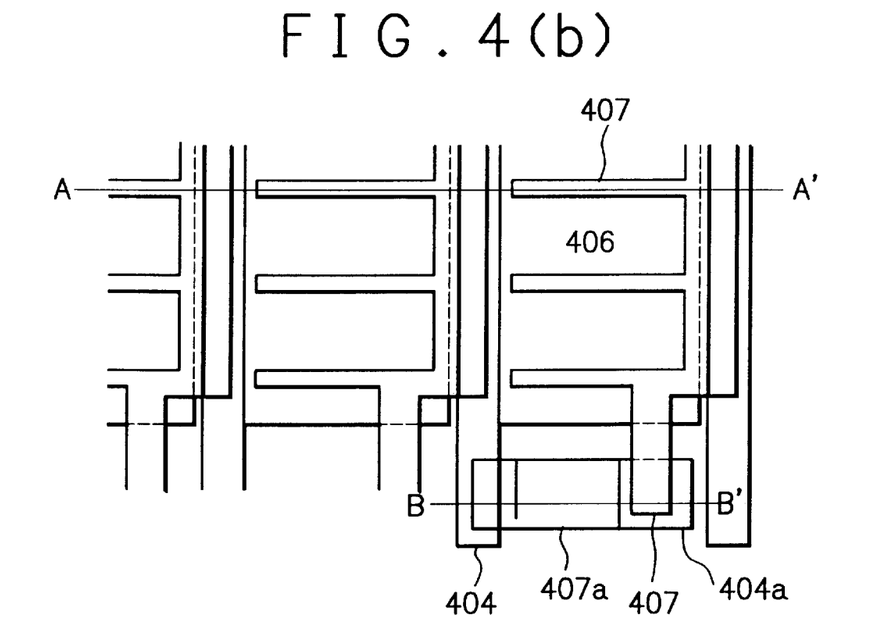
Figure 4C:
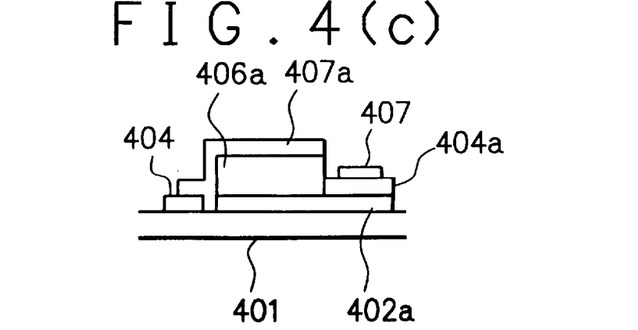

In this example, there was prepared an integrated series connection type solar cell having such configuration as shown in FIG. 4(a) to 4(c), where FIG. 4(b) is a schematic plan view of said solar cell, FIG. 4(a) is a schematic cross-sectional view, taken along the line A–A' in FIG. 4(b), and FIG. 4(c) is a schematic cross-sectional view, taken along the line B–B' in FIG. 4(b).

In FIGS. 4(a) to 4(c), reference numeral 401 indicates a base member, reference numerals 402 a back electrode layer, reference numeral 402a a back electrode layer portion, reference numeral 404 a connection terminal, reference numeral 404a a connection terminal portion, reference numerals 406 a cuprous oxide film, reference numeral 406a a cuprous oxide film portion, numeral reference 407 a collecting electrode, and reference numeral 407a a shade electrode.

In this example, a film made of PET (polyethylene terephthalate) having a thickness of 0.2 mm and a size of 12 cm×12 cm as the base member 401, an integrated series connection type solar cell was formed in the same manner as in Example 5, except that bypass diodes were formed as will be described below.

Here, the base member 401 is corresponding to the base member 301 in FIGS. 3(a) to 3(d), the back electrode layer 402 is corresponding to the back electrode layer 302 in FIGS. 3(a) to 3(d), the connection terminal 404 is corresponding to the connection terminal 304 in FIGS. 3(b) to 3(d), the cuprous oxide film 406 is corresponding to the cuprous oxide film 306 in FIGS. 3(c) to 3(e), and the collecting electrode 407 is corresponding to the collecting electrode 307 in FIGS. 3(d) and 3(e).

The bypass diodes were built in as will be described in the following. At the time of forming the back electrode layer 402 in the same manner as in Example 5, a back electrode layer portion 402a was concurrently formed. At the time of forming the connection terminal 404 in the same manner as in Example 5, a connection terminal portion 404a was concurrently formed. At the time of forming the cuprous oxide film 406 in the same manner as in Example 5, a cuprous oxide filmportion 406a was concurrently formed. At the time of forming the collecting electrode 407 in the same manner as in Example 5, a shade electrode 407a was concurrently formed. In this way, there was obtained an integrated series connection type solar cell.

Here, the back electrode layer portion 402a and the cuprous oxide film portion 406a form a Schottky diode. This bypass diode is electrically connected in the opposite direction to the cell unit comprising the cuprous oxide film 406. If a given cell unit of the solar cell is shaded by a tree or the like outdoors, the cell unit does not generate an electric power and it also acts as a series resistance of a high electric resistance, resulting in a remarkable decrease in the electric power outputted by the entire solar cell. In this case, the bypass diodes reverse connected as above described are present, an electric current flows through these bypass diodes and because of this, the decrease in the electric power is only for the cell unit involved. This situation makes the solar cell to stably output a desirable electric power. In the bypass diodes of an ordinary solar cell, chip diodes are connected. In the present invention, the labor and costs for installing such chip diodes are unnecessary, and a highly reliable solar cell can be produced.

The solar cell obtained in this example was evaluated using a solar simulator. As a result, the solar cell was found to exhibit satisfactory solar cell characteristics.

EXAMPLE 7

Figure 5A:
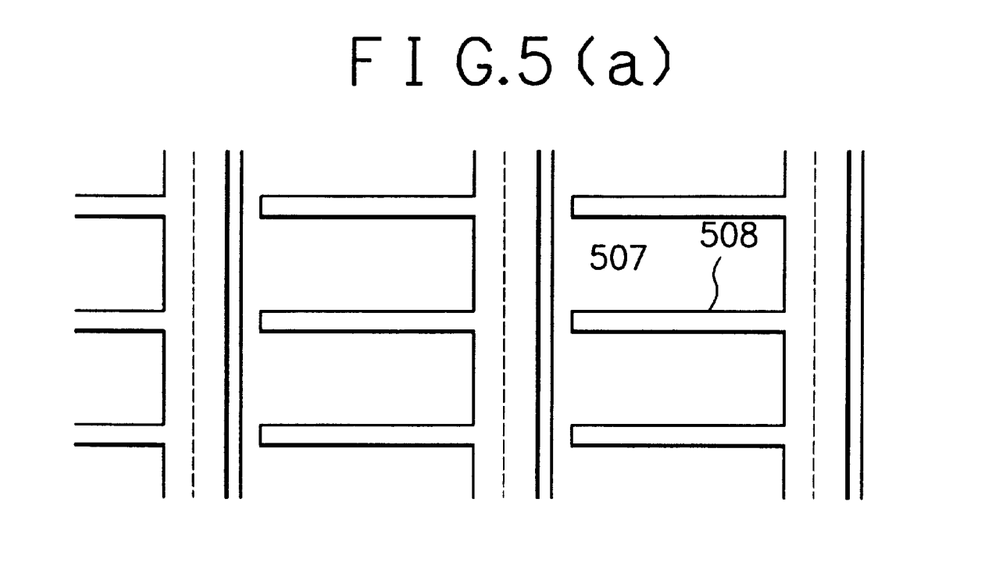
Figure 5B:
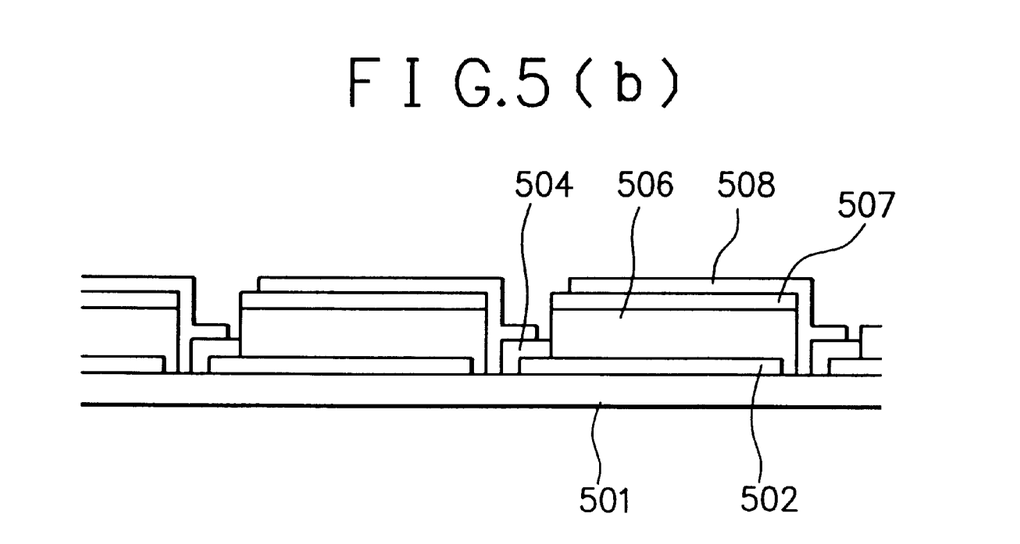

In this example, there was prepared a hetero junction solar cell having such configuration as shown in FIGS. 5(a) and 5(b), where FIG. 5(a) is a schematic plan view of said solar cell, and FIG. 5(b) is a schematic cross-sectional view of said solar cell. In FIGS. 5(a) and 5(b), reference numeral 501 indicates a base member, reference numeral 502 a back electrode layer, reference numeral 504 a connection terminal, reference numeral 506 a cuprous oxide film, reference numeral 507 a zinc oxide film, and reference numeral 508 a collecting electrode.

The solar cell was prepared in the following manner.

The procedures for forming until the cuprous oxide film in Example 5 were repeated, except that an Ag-film was deposited by means of sputtering as the back electrode layer 502, whereby a substrate having five cell units each comprising the copper film, the back electrode layer 502 (comprising the Ag-film) and the cuprous oxide film 506 stacked in this order on the base member 501 was obtained.

The substrate thus obtained was well washed with pure water, and it was immersed in a 0.01 mol/l zinc nitrate aqueous solution, and a zinc plate of 10 cm×10 cm in size was immersed in the aqueous solution so as to oppose the cuprous oxide films 506 of the substrate while having a distance of 5 cm between the two members. Here, the substrate 502 and the zinc plate were electrically connected to a galvanostad so that the substrate was a cathode electrode and the zinc plate was an anode electrode. While maintaining the aqueous solution in which the substrate and the zinc plate are thus arranged at 85° C., there was flown an electric current of 40 mA from the galvanostad, whereby a zinc oxide film 507 was deposited on the surface of each of the cuprous oxide films 506 of the substrate, where the deposition of the zinc oxide film 507 was occurred only on the surface of each of the cuprous oxide films 506. The film thus deposited on the surface of each of the cuprous oxide films 506 was confirmed to comprise zinc oxide by way of X-ray diffraction.

Then, an Ag-paste was screen-printed to form a collecting electrode 508 on the zinc oxide film 507 of each cell unit. Thus, there was obtained an integrated series connection type solar cell.

The resultant solar cell was evaluated using a solar simulator. As a result, the solar cell was found to exhibit satisfactory solar cell characteristics.

By the way, in the solar cell obtained in this example, the zinc oxide film 507 (which is an n-type semiconductor) situated on the surface side generates a negative electromotive force upon the irradiation of light. This situation is in contrast with that of each of the solar cells obtained in Examples 4 to 6 in terms of the output potential. And the absolute value of the electromotive force and the output power of the solar cell obtained in this example are greater than those of each of the solar cells obtained in Examples 4 to 6.

As will be understood from the above description, according to the film-forming method for forming a cuprous oxide film in the present invention, cuprous oxide crystal with slight defect or distortion is effectively and desirably grown even on a large area substrate of low heat resistance. This situation enables to efficiently produce a large area semiconductor device such as a solar cell having excellent characteristics at a reasonable production cost.

Further, according to the film-forming method for forming a cuprous oxide film in the present invention, a high quality cuprous oxide film can be selectively deposited in a desired pattern on a large area substrate of low heat resistance. This situation enables to efficiently produce an integrated series connection type solar cell having a high output voltage without using a laser scribing method or the like. In addition, a bypass diode can be concurrently formed upon forming a solar cell, a highly reliable solar cell can be produced at a reasonable production cost.

TABLE 1

| liquid temperature | electric current | | | | |
|---|---|---|---|---|---|
| | 6 mA | 8 mA | 10 mA | 12 mA | 14 mA |
| 25° C. | brown deposit | brown deposit | brown/black deposit | black deposit | black deposit |
| 40° C. | Cu-deposited | brown deposit | brown deposit | brown/black deposit | black deposit |
| 55° C. | Cu-deposited | murex thin film | murex thin film | brown deposit | brown deposit |
| 70° C. | Cu-deposited | murex thin film | murex thin film | murex thin film | brown deposit |
| 85° C. | Cu-deposited | murex thin film | murex thin film | murex thin film | murex thin film |

TABLE 2

| nitrate ion concentration | electric current | | | | |
|---|---|---|---|---|---|
| | 6 mA | 8 mA | 10 mA | 12 mA | 14 mA |
| nitrate ion = 1 time | Cu-deposited | murex thin film | murex thin film | brown deposit | brown deposit |
| nitrate ion = 2 times | Cu-deposited | murex thin film | murex thin film | murex thin film | brown deposit |
| nitrate ion = 5 times | murex thin film | murex thin film | murex thin film | murex thin film | murex thin film |

What is claimed is:

1. A method for forming a cuprous oxide film, comprising the steps of immersing a substrate having at least an electrically conductive surface in a solution containing copper ion and nitrate ion which are coexistent therein, and causing deposition of the cuprous oxide film on the electrically conductive surface of the substrate by way of cathodic reaction.

2. A method for selectively forming a cuprous oxide film, comprising the steps of providing a substrate whose surface has a pattern comprising an electrically conductive region and an electrically insulating region for a semiconductor device, immersing the substrate in a solution containing copper ion and nitrate ion which are coexistent therein, and causing selective deposition of the cuprous oxide film only on the electrically conductive surface region of the substrate by way of cathodic reaction.

3. A method for selectively forming a cuprous oxide film, comprising the steps of providing a substrate for a semiconductor device, the substrate having a surface with an electrically conductive partial region, a part of the electrically conductive partial region having a pattern comprising an aluminum or an alloy containing an aluminum as a matrix, immersing the substrate in a solution containing copper ion and nitrate ion which are coexistent therein, and causing selective deposition of the cuprous oxide film only on the electrically conductive region of the substrate other than the pattern comprising the aluminum or the alloy by way of cathodic reaction.

* * * * *

UNITED STATES PATENT AND TRADEMARK OFFICE
CERTIFICATE OF CORRECTION

PATENT NO. : 6,258,702 B1
DATED : July 10, 2001
INVENTOR(S) : Katsumi Nakagawa et al.

It is certified that error appears in the above-identified patent and that said Letters Patent is hereby corrected as shown below:

Column 1,
Line 10, "duality" should read -- quality --;
Line 11, "a" should read -- an --;
Line 56, "ban" should read -- can --; and
Line 64, "D. Trivich et als.," should read -- D. Trivich et al., --.

Column 2,
Line 31, "respectievy" should read -- respectively --;
Line 57, close up right margin; and
Line 58, close up left margin.

Column 4,
Line 24, "&" should read -- a --; and
Line 30, "other" should read -- another --.

Column 5,
Line 26, "knowledges" should read -- knowledge --; and
Line 27, "knowledges," should read -- knowledge, --.

Column 6,
Line 64, "peeks" should read -- peaks --; and
Line 67, "rage" should read -- range --.

Column 7,
Line 51, "is flown" should read -- flows --.

UNITED STATES PATENT AND TRADEMARK OFFICE
CERTIFICATE OF CORRECTION

PATENT NO. : 6,258,702 B1
DATED : July 10, 2001
INVENTOR(S) : Katsumi Nakagawa et al.

It is certified that error appears in the above-identified patent and that said Letters Patent is hereby corrected as shown below:

Column 13,
Line 20, "more great many" should read -- a great many more --.

Column 15,
Line 53, "filmportion" should read -- film portion --.

Signed and Sealed this

Ninth Day of April, 2002

Attest:

Attesting Officer

JAMES E. ROGAN
Director of the United States Patent and Trademark Office